United States Patent [19]
Gottfried et al.

[11] Patent Number: 5,613,230
[45] Date of Patent: Mar. 18, 1997

[54] AM RECEIVER SEARCH TUNING WITH ADAPTIVE CONTROL

[75] Inventors: Gordon E. Gottfried, Dearborn; Mohammad-Reza Sheikh-Movahhed, Ann Arbor, both of Mich.

[73] Assignee: Ford Motor Company, Dearborn, Mich.

[21] Appl. No.: 486,467

[22] Filed: Jun. 9, 1995

[51] Int. Cl.$^6$ ....................................................... H04B 1/18
[52] U.S. Cl. .................................... 455/161.3; 455/184.1; 455/197.1; 455/234.1
[58] Field of Search .............................. 455/161.1, 161.2, 455/161.3, 168.1, 169.1, 240.1, 234.2, 239.1, 247.1, 250.1, 251.1, 244.1, 197.1, 234.1, 164.1, 164.2, 165.1, 184.1, 185.1, 266

[56] References Cited

U.S. PATENT DOCUMENTS

| | | | |
|---|---|---|---|
| 3,678,393 | 7/1972 | Newell | 455/244.1 |
| 4,222,118 | 9/1980 | Dickinson et al. | 455/70 |
| 4,262,363 | 4/1981 | Wiechmann et al. | 455/161 |
| 4,330,866 | 5/1982 | Malchow | 455/161 |
| 4,357,712 | 11/1982 | Kawakami | 455/161 |
| 4,387,469 | 6/1983 | Miyazaki et al. | 455/161 |
| 4,580,285 | 4/1986 | Richards, Jr. | 455/161 |
| 4,723,319 | 2/1988 | Stricker | 455/161.3 |
| 4,780,909 | 10/1988 | Sakashita et al. | 455/161 |
| 4,955,073 | 9/1990 | Sugayama | 455/161 |
| 4,955,077 | 9/1990 | Sugayama | 455/197 |
| 5,073,975 | 12/1991 | Zarabadi et al. | 455/161 |
| 5,073,976 | 12/1991 | Kennedy | 455/161 |
| 5,321,851 | 6/1994 | Sugayama et al. | 455/161.3 |

FOREIGN PATENT DOCUMENTS 0159618  11/1980  Japan.

*Primary Examiner*—Reinhard J. Eisenzopf
*Assistant Examiner*—Lee Nguyen
*Attorney, Agent, or Firm*—Mark L. Mollon; Roger L. May

[57] ABSTRACT

An AM radio receiver includes search tuning such as seek or scan tuning features whose stop thresholds for locking onto a received frequency are adapted to environmental conditions. In the preferred embodiment, wideband signal strength, preferably derived from the automatic gain control of the radio frequency amplifier, provides a representative signal to the microprocessor for adapting the thresholds used during search tuning. The thresholds are increased when significant energy is present in the AM band and proportioned to the level of that energy. The decision logic of the microprocessor adapts thresholds according to the tuned signal strength, to wideband signal strength, to nighttime operation during which ionosphere conditions increase transmissibility of distant radio signals, and to intermediate frequency (IF) count validity to reduce the probability of stopping on audibly noisy frequencies when the RF signal environment is noisy.

13 Claims, 3 Drawing Sheets

AM RECEIVER SEARCH TUNING WITH ADAPTIVE CONTROL

TECHNICAL FIELD

The present invention relates generally to AM radio receivers with search or scan tuning and, more particularly, to such a receiver in which the signal strength is compared with an adaptive threshold for selecting a radio frequency signal at the tuner for sustained audio output.

BACKGROUND ART

Many radio receivers provide users with a convenience feature for automatically searching for broadcast frequencies in a band of interest and selecting only those broadcast signals received with sufficient quality to be considered "listenable" for sustained audio output. This feature, known as search tuning in a "seek", or scan (with a truncated period of sustained audio output) operating mode is typically engaged by pressing a button, which then causes the tuner to automatically advance to the next frequency on which a station may broadcast, and evaluate whether a "listenable" broadcast is being received. If so, the tuner remains on that frequency. Otherwise, the tuner advances to the next available frequency.

Evaluating whether a received broadcast is listenable, is a task whose ease of implementation varies with the method used to modulate and demodulate the information contained on the radio frequency carrier. The evaluation of Amplitude Modulated (AM) information tends to be more formidable than most. Typical measures of "listenability" include received signal level and tolerance of the Intermediate Frequency (IF).

Received signal level is typically indicated by a DC voltage derived from the rectification of the IF signal level. The DC voltage amplitude is proportional to the amplitude level of the carrier frequency received to which the radio is tuned. Presumably, the stronger the received signal level, the better its sound quality delivered to the listener, until overload occurs for very strong signals.

Tolerance of the intermediate frequency is typically indicated using a counter that compares a pulse representation of the IF signal derived from the received signal to its theoretical value for a properly tuned station. Presumably, if this frequency is within a close tolerance, for example, within about 1 KHz for a 450 Khz signal, to the theoretical, then the tuned frequency contains a valid station.

A prominent characteristic of AM signals, however, is their poor noise immunity. Radiation in the AM band often occurs from sources other than the transmitter broadcasting the desired signal. These sources often radiate broadband energy, such that many frequencies are influenced. Since the energy typically varies in amplitude, the amplitude modulation detector in the receiver reproduces the interference as audible noise. This noise typically occurs in the same frequency range as the desired audio, and is therefore difficult to distinguish. As a result, the measures of listenability previously described may be influenced by undesired radiation, thereby making it difficult to determine acceptance thresholds with which the received signals is to be compared for selection of a listenable broadcast.

Another characteristic of AM band signals is the effect of ions above the atmosphere. These ions change as the sun goes down in a way that causes AM band signals to reflect off the ionosphere, thus increasing the distance from the transmitter that the signals can be received. The level of these long distance signals often varies slowly with time and can therefore interfere intermittently with closer stations broadcasting at the same frequency, or those broadcasting at harmonics of the distant transmitter's frequency. Therefore, thresholds of listenability used for daytime reception will likely produce stops on unlistenable stations at night. While previously known receivers may include a nighttime switch that changes the threshold level between two values, such a switch is not responsive to other environmental conditions.

SUMMARY OF THE INVENTION

This invention overcomes the above-mentioned disadvantages by using wideband signal level information obtained ahead of the receiver's tuneable circuits to adapt the search feature stop thresholds to the prevailing AM band radio frequency environment.

Preferably, the wideband signal level indicator is a DC voltage signal derived from the rectification of signals from an amplifier whose gain response is relatively flat with respect to antenna input frequency across the AM band. It is preferably proportional to, but can be inversely proportional to, the average wideband energy present in the entire AM band. Thus, this indicator responds to radio station broadcasts as well as undesired sources of radiation. When the wideband signal level indicates a significant amount of energy in the AM band, it is used to increase the threshold of tuned signal level required to stop at a signal received during the search. This reduces stopping on frequencies that are audibly noisy due to broadband sources of radiated noise, as well as other strong radio station broadcasts.

The wideband indicator reacts to noise sources as well as other strong radio broadcasts, as is typical in the environment of a metropolitan area. Such areas typically offer many stations to choose from; therefore, skipping over a few weaker stations would not be considered objectionable because they are rendered non-listenable due to interference from the said sources. Skipping over medium strength stations and above is avoided by an exception criteria that ignores the wideband indicator when evaluating such stations. The threshold level at which the wideband indication influences the stop, and the degree of influence can be adjusted, for example, for daytime and nighttime reception. Using higher thresholds at night would decrease the probability of stopping on a frequency that is influenced by distant interfering broadcasts.

The present invention provides an AM receiver with search tuning that utilizes wideband information to adapt the tuned signal strength thresholds during search tuning for a listenable station. The thresholds are increased when significant energy is present in the AM band, in proportion to the level of that wideband energy. The system reduces the probability of stopping on audibly noisy frequencies when the RF signal environment is noisy.

BRIEF DESCRIPTION OF THE DRAWINGS

The present invention will be better understood by reference to the following detailed description of a preferred embodiment when read in conjunction with the accompanying drawing, in which like reference characters refer to like parts throughout the views, and in which.

DETAILED DESCRIPTION OF PREFERRED EMBODIMENT

Figure 1:
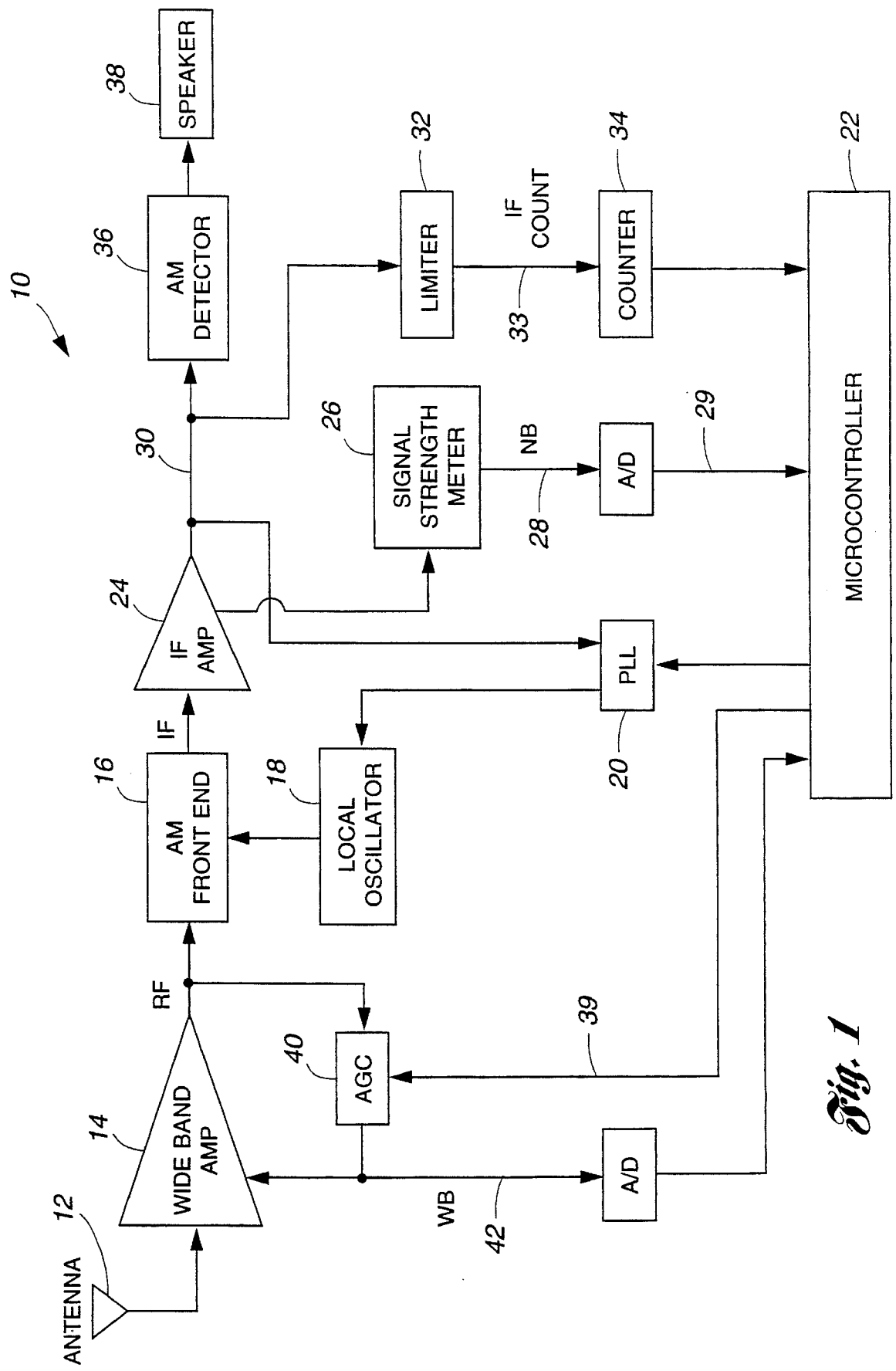
FIG. 1 is a diagrammatic view of an AM receiver system with search tuning according to the present invention.

Referring first to FIG. 1, an AM radiowave receiver 10 is thereshown comprising an antenna 12, a wideband amplifier 14 amplifying the signal level of the RF signal within the AM band before introduction to an AM front end 16. The AM front end 16 includes a mixer, and IF signal filters. It also may include tuned RF elements. The local oscillator 18, whose output is delivered to the mixer, is operated in response to a phase locked loop control 20 that receives commands from a microcontroller 22. The microcontroller 22 may include user interface controls that permit the radio operation to be controlled by the user. In addition, the radio 10 includes an intermediate frequency amplifier 24 for the signal received from the AM front end 16. The IF amplifier 24 may be of the type formed as an integrated circuit (IC) having a signal strength meter 26 that generates a DC voltage level signal that is proportional or otherwise related to the strength of the intermediate frequency signal resulting from tuning to a broadcast radio frequency signal.

The signal strength meter output 28 then may be converted, for example by an analog-to-digital (A–D) converter, and introduced into the control logic portion of the radio represented by the microcontroller 22. As is well known in the previous radio constructions, an amplified IF signal 30 is manipulated through a limiter 32 that provides a square wave signal representation 33 of the IF frequency. This limiting feature removes amplitude modulation from the IF signal, thus improving the accuracy with which the Intermediate Frequency can be determined when signal 33 is passed to a counter 34. The microcontroller then determines whether the IF frequency is within a close tolerance of the theoretical value for the intermediate frequency based upon the radio frequency of the signal being received. In addition, the radio 10 includes an AM detector 36 that generates the output signals delivered to the amplifiers then speakers 38 for audio output from the system 10.

While the above components may be constructed in a conventional manner, the preferred embodiment of the present invention improves the performance by providing an adjustment formula for adapting the threshold of the search tuning stop in accordance with environmental conditions. In particular, the preferred embodiment of the present invention uses a wideband strength signal to determine whether a noisy environment or numerous strong broadcast signals are available in the listening environment. The signal with which the threshold is adjusted may be conveniently provided by utilizing an output from the automatic gain control 40 used for the radio frequency amplifier 14. In a well known manner, the automatic gain control 40 enables the signal received by the antenna to be amplified only to the extent that the received signal strength does not reach the threshold value that would overload subsequent circuits. Output 40 also provides a representative signal of the level of the wideband signal strength, the strength of signals received across the frequency band for AM broadcasts. A representative signal 42 such as a DC signal, preferably inversely proportional to the amplitude of the RF signal being sent to the AM front end 16, would be converted at the analog-to-digital converter for input to the controller 22 for adjustment of the stop threshold used during automatic search tuning. In the preferred embodiment the wideband signal level 42 decreases with increasing RF signal level.

Figure 2:
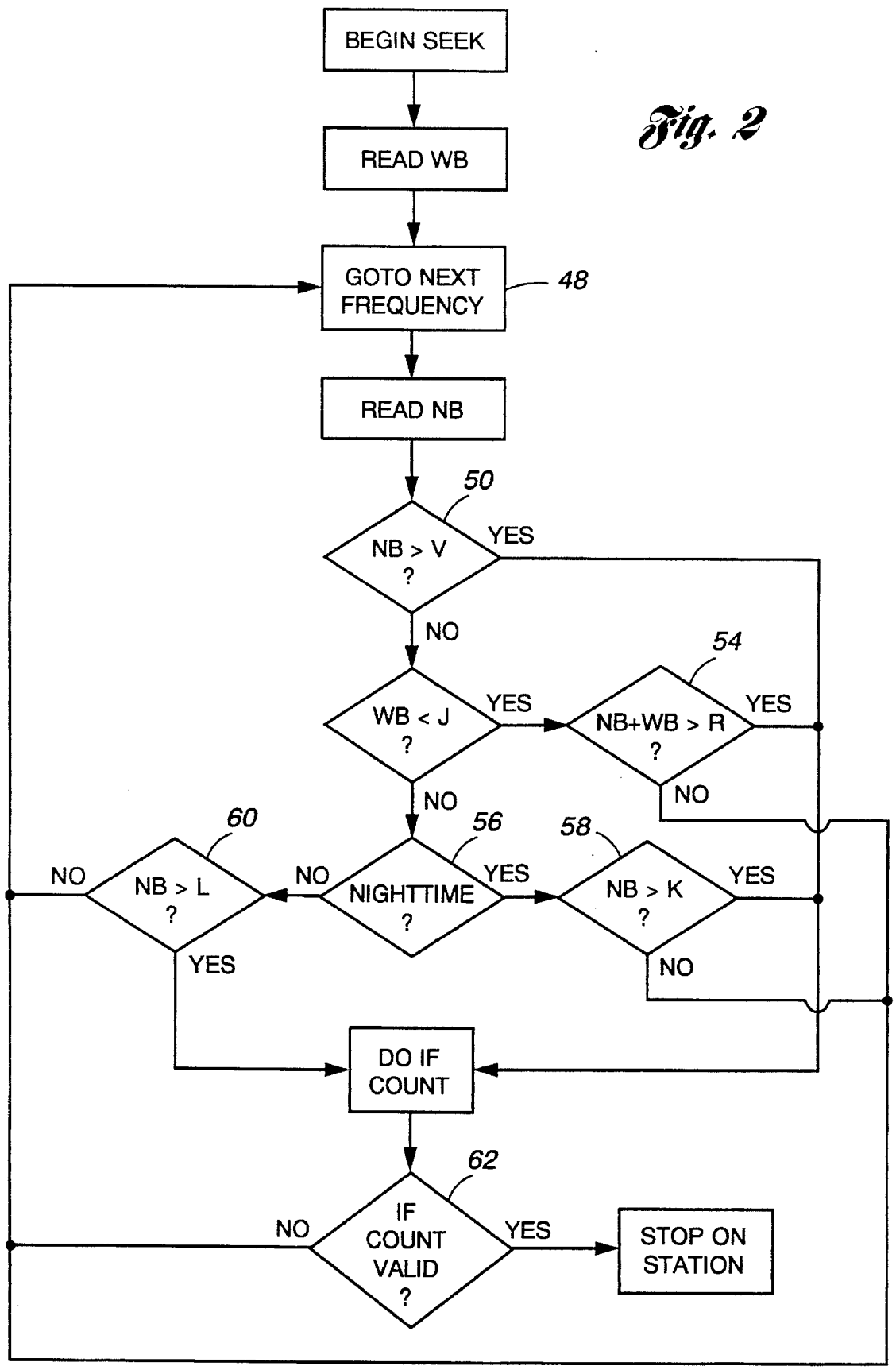
FIG. 2 is a flowchart showing logic analyses performed by a microcontroller in response to the inputs shown in FIG. 1.

Referring now to FIG. 2, the decision logic of microcontroller 22 begins the search tuning operation when an appropriate actuator has been selected by the operator. In the threshold adjustment circuit, the digital representation of the wideband signal level 42 is read, and the front end is directed to go to the next frequency. The controller 22 also reads the digital representation 29 of the tuned signal level 28 and determines whether the level of signal 28 is greater than a threshold V. If so, the processor then determines whether the IF count available from counter 34 is valid as shown at 62. The count is valid when the IF count is within a close tolerance of the theoretical IF count for the radio frequency signal being tuned. When these criteria are met, the automatic search will remain on the station tuned, and unmute the audio. If the count is not valid, that is if it is not within the close tolerance of the theoretical value for the IF at the radio frequency being received, the processor directs the phase locked loop circuit 20 to go to the next frequency as shown at 48.

If the determination at 50 reflects that the tuned signal level is not greater than the threshold V, the processor determines whether the wideband signal level 42 is less than a threshold J. If so, the determination is made as shown at 54 whether the combined tuned signal level and wideband signal level are greater than the threshold R. If so, the validity of the IF count is determined in the manner previously discussed. If the IF count is not valid, the microprocessor 22 directs the tuner to go to the next frequency as shown at 48, otherwise the tuner will remain on that station. The determination at 54 renders the threshold adaptive at wideband signal strength less than J as the tuned signal strengths NB must be greater than and subject to the difference between the threshold R and the wideband signal strength WB.

In the preferred embodiment, the logic also includes adjustment for increased transmissibility of broadcast signals during the nighttime. If the wideband signal is not less than the threshold J, the process determines, for example, by means of a conventional clock or headlamp switch, or illumination sensor, whether the improved transmissibility is likely to be in effect. When nighttime operation is indicated, a determination as to whether the tuned signal strength is greater than the threshold K is made as shown at 58 in FIG. 2. When the tuned signal strength is greater than the threshold K, the validity of the IF count is tested as previously discussed. If the operation time is not nighttime as determined at 56 in FIG. 2, the tuned signal strength is compared with a threshold L that will be less than K. When the tuned signal strength is greater than the threshold L, the validity of the IF count is checked as previously discussed. Similarly, when the tuned signal strength is not greater than the threshold, the tuner is directed to the next frequency as designated at 48.

Figure 3:
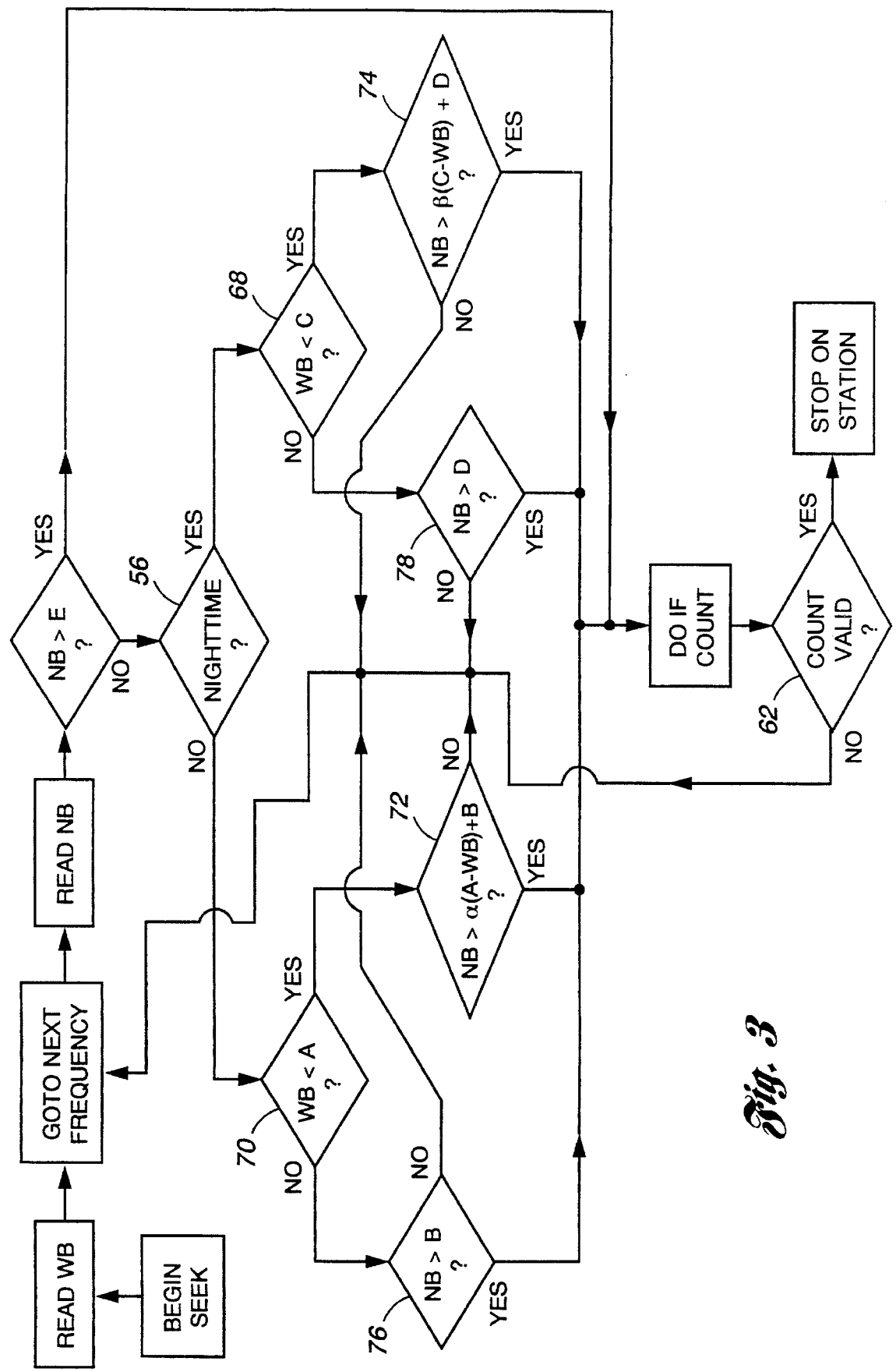
FIG. 3 is a flowchart similar to FIG. 2 but showing a modified logic analysis performed by a microcontroller in response to the inputs shown in FIG. 1.

Of course, other modifications to the system can be made as shown in FIG. 3. For example, at the block 56, determining whether nighttime ionosphere changes are affecting operation may be accomplished in other manners. For example, a determination of whether the motor vehicle's headlights are on may be used as a switching criteria. Furthermore, the determination of signal strength at block 68 may be whether or not a radio frequency automatic gain control signal 42 is less than a threshold C. Alternatively, if the headlights are not on, the decision at block 70 may be the determination whether the radio frequency automatic gain control 42 is less than a threshold A. Thus, thresholds that are tailored to nighttime versus daytime RF environments may be incorporated.

For example, when the gain control signal strength level 42 is less than one of the thresholds, an additional determination block 72 may determine whether the tuned signal strength 29 is greater than a value $\alpha(A-WB)+B$ as shown at 72 or $\beta(C-WB)+D$ as shown at 74 before determining the validity of the IF count. The addition of coefficients $\alpha$ and B or $\beta$ and D provide for more precise adaptation of the thresholds to particular signal strength indicator characteristics. Likewise, if the decision made at the blocks 68 or 70 does not determine the automatic gain control signal to be less than the thresholds A or C, the processor may direct a determination of the validity of the IF count if the tuned signal strength is greater than a threshold B as at 76 or a threshold D as at 78 the minimum day and nighttime thresholds, respectively. When the threshold is not met or the IF count is not valid, the microprocessor directs the AM front end to continue search tuning to the next frequency.

Additional improvements that can be made to the preferred embodiment include improvements such as setting the gain of the AGC to maximum, along control line 39 in FIG. 1, thus removing the effect AGC would otherwise have on the level of the tuned signal strength, during seek mode. Additionally, the AGC time constant can be reduced along control line 39 during seek mode, such that the tuned signal strength reacts quickly to the RF signal level present at the antenna 12. In addition, when the microprocessor directs the tuner to stop on a station, a short wait time may be imposed before the audio system is unmuted to maintain silent operation of the seek or scan tuning feature.

Having thus described the present invention, many modifications will become apparent to those skilled in the art to which it pertains without departing from the scope and spirit of the present invention as defined in the appended claims.

What is claimed is:

1. A radio receiver with a microprocessor controller including a search tuning stop feature, the receiver having a tuned signal strength detector in addition to said a microprocessor controller, the microprocessor controller comprising;

a determiner for comparing a sensed tuned signal strength with a threshold level for said search tuning stop that sustains reception of a radiowave received at the tuner front end, and an adjuster for adapting the threshold in response to a wideband signal strength detector.

2. The invention as defined in claim 1 wherein said radio receiver includes an RF amplifier having an automatic gain control and wherein said wideband signal strength detector comprises said automatic gain control.

3. The invention as defined in claim 2 wherein said adjuster includes means for increasing the threshold to limit stopping on distant stations having extended range under nighttime conditions.

4. The invention as defined in claim 2 wherein said automatic gain control generates a DC signal output.

5. The invention as defined in claim 2 wherein said detector comprises an output having a direct proportional relationship to the wideband signal strength.

6. The invention as defined in claim 2 wherein said detector comprises an output having an inverse proportional relationship to the wideband signal strength.

7. An AM radio receiver comprising;

an RF amp with an automatic gain control, an AM front end with a local oscillator, an IF amplifier, an AM detector, an audio processor, and a microcontroller for developing an input for the local oscillator to control tuning stop of a search tuning feature at said front end, said search tuning feature sustaining reception of a tuned signal whose strength is above a threshold level, and an adjuster adapting the threshold in response to a wideband signal strength detector, said microcontroller directing a phase locked loop control to sustain reception of a tuned signal in response to receiving an input derived from the automatic gain control forming said wideband signal strength detector.

8. The invention as defined in claim 7 wherein said RF amplifier is a wideband amplifier adapted to amplify the AM radio band.

9. An AM radio receiver comprising;

an RF amplifier, an AM front end, a microcontroller and having a search tuning feature with a search tuning stop determined by comparing tuned signal strength with a threshold value, a local oscillator control responsive to said microcontroller and to the IF signal generated at the IF amplifier, and an AM processor;

wherein the microcontroller receives a wideband signal strength signal from a detector, said detector comprising an automatic gain control of said RF amplifier and an analog-to-digital converter and wherein said microcontroller adjusts said threshold value in response to said wideband signal strength signal.

10. The invention as defined in claim 9 wherein said automatic gain control is set at its maximum gain.

11. The invention as defined in claim 9 wherein said microcontroller includes a means for adjusting the time constant of the automatic gain control.

12. The invention as defined in claim 11 wherein said means for adjusting includes means for reducing said time constant.

13. The invention as defined in claim 7 and further comprising a narrow band detector, wherein said microcontroller directs a phase locked loop control to sustain reception of a tuned signal in response to receiving an input derived from said narrow band detector.

* * * * *